United States Patent
Ding et al.

(10) Patent No.: US 7,339,222 B1
(45) Date of Patent: Mar. 4, 2008

(54) METHOD FOR DETERMINING WORDLINE CRITICAL DIMENSION IN A MEMORY ARRAY AND RELATED STRUCTURE

(75) Inventors: Meng Ding, Sunnyvale, CA (US); Hidehiko Shiraiwa, San Jose, CA (US); Mark Randolph, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 66 days.

(21) Appl. No.: 11/416,551

(22) Filed: May 3, 2006

(51) Int. Cl.
*H01L 27/108* (2006.01)
(52) U.S. Cl. .................. 257/296; 257/311; 257/368; 257/374; 257/905; 257/E21.646; 257/E27.084; 438/238; 438/399
(58) Field of Classification Search ............... None
See application file for complete search history.

(56) References Cited

U.S. PATENT DOCUMENTS 6,424,001 B1 * 7/2002 Forbes et al. ............... 257/315
2002/0109173 A1 * 8/2002 Forbes et al. ............... 257/300

* cited by examiner

*Primary Examiner*—Evan Pert
*Assistant Examiner*—Scott R. Wilson
(74) *Attorney, Agent, or Firm*—Farjami & Farjami LLP

(57) ABSTRACT

According to one exemplary embodiment, a method for fabricating a memory array includes forming a number of trenches in a substrate, where the trenches determine a number of wordline regions in the substrate, where each of the wordline regions is situated between two adjacent trenches, and where each of the wordline regions have a wordline region width. The memory array can be a flash memory array. The method further includes forming a number of bitlines in the substrate, where the bitlines are situated perpendicular to the trenches. The method further includes forming a dielectric region in each of the trenches. The method further includes forming a dielectric stack over the bitlines, wordline regions, and trenches. The method further includes forming a number of wordlines, where each wordline is situated over one of the wordline regions. The wordline region width determines an active wordline width of each of the wordlines.

16 Claims, 8 Drawing Sheets

METHOD FOR DETERMINING WORDLINE CRITICAL DIMENSION IN A MEMORY ARRAY AND RELATED STRUCTURE

TECHNICAL FIELD

The present invention is generally in the field of semiconductor fabrication. More particularly, the present invention is in the field of fabrication of memory arrays.

BACKGROUND ART

During fabrication of flash memory arrays, such as flash memory arrays that include memory cells capable of storing two independent bits in separate locations within the memory cell (e.g., Advanced Micro Devices' (AMD) MirrorBit™ memory cells), bitlines are implanted in the substrate and an ONO (Oxide-Nitride-Oxide) stack is typically formed over the substrate. In the conventional flash memory array fabrication process, a layer of polycrystalline silicon (polysilicon) is typically deposited and lithographically patterned over the ONO stack to form a desired number of wordlines, which are situated over and aligned perpendicular to the bitlines. In the conventional flash memory array fabrication process, wordline critical dimension (i.e. wordline width) is determined by the lithographical patterning process. However, as the flash memory array is scaled down, the difficulty in forming wordlines having uniform wordline width increases significantly.

Additionally, during memory cell programming in a conventional flash memory array, a parasitic current can flow in a portion of the substrate situated between adjacent wordlines at or close to the interface between the bottom oxide layer in the ONO stack. This parasitic current, which is inversely proportional to the thickness of the ONO stack, can undesirably increase memory array power consumption and cause undesirable memory cell threshold voltage distribution in the memory array, which can reduce memory array performance and reliability.

Thus, there is a need in the art for a method of fabricating a flash memory array having reduced parasitic current flow in substrate portions situated between wordlines and having increased wordline critical dimension uniformity.

SUMMARY

The present invention is directed to a method for determining wordline critical dimension in a memory array and related structure. The present invention addresses and resolves the need in the art for a method of fabricating a flash memory array having reduced parasitic current flow in substrate portions situated between wordlines and having increased wordline critical dimension uniformity.

According to one exemplary embodiment, a method for fabricating a memory array includes forming a number of trenches in a substrate, where the trenches determine a number of wordline regions in the substrate, where each of the wordline regions is situated between two adjacent trenches, and where each of the wordline regions have a wordline region width. For example, each of the trenches can have a depth of between 400.0 Angstroms and 600.0 Angstroms. The memory array can be a flash memory array. The method further includes forming a number of bitlines in the substrate, where the bitlines are situated in a direction perpendicular to the trenches. The method further includes forming a dielectric region in each of the trenches. For example, the dielectric region can be formed in each of the trenches by depositing a layer of silicon oxide over the trenches and the wordline regions and planarizing the layer of silicon oxide to expose a top surface of each of the wordline regions.

According to this embodiment, the method further includes forming a dielectric stack over the bitlines, wordline regions, and trenches. For example, the dielectric stack may be an ONO stack. The method further includes forming a number of wordlines, where each wordline is situated over one of the wordline regions. The wordline region width determines an active wordline width of each of the wordlines. The method further includes forming a number of memory cells, where each memory cell is formed at an intersection of a region between adjacent bitlines and one of the wordlines, and where each memory cell is a flash memory cell. For example, the flash memory cell can be a 2-bit flash memory cell. According to one embodiment, the invention is a memory array fabricated by the above-described method. Other features and advantages of the present invention will become more readily apparent to those of ordinary skill in the art after reviewing the following detailed description and accompanying drawings.

DETAILED DESCRIPTION OF THE INVENTION

The present invention is directed to a method for determining wordline critical dimension in a memory array and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

FIGS. 1A, 1B, 2A, 2B, 3A, 3B, 4A and 4B illustrate the fabrication of a memory array, such as a flash memory array, according to one embodiment of the present invention. The present invention can be applied to memory arrays, such as flash memory arrays, comprising memory cells capable of storing two independent bits in separate locations within the memory cell (i.e. 2-bit memory cells), such as Advanced Micro Devices' (AMD) MirrorBit™ memory cells.

Figure 1A:
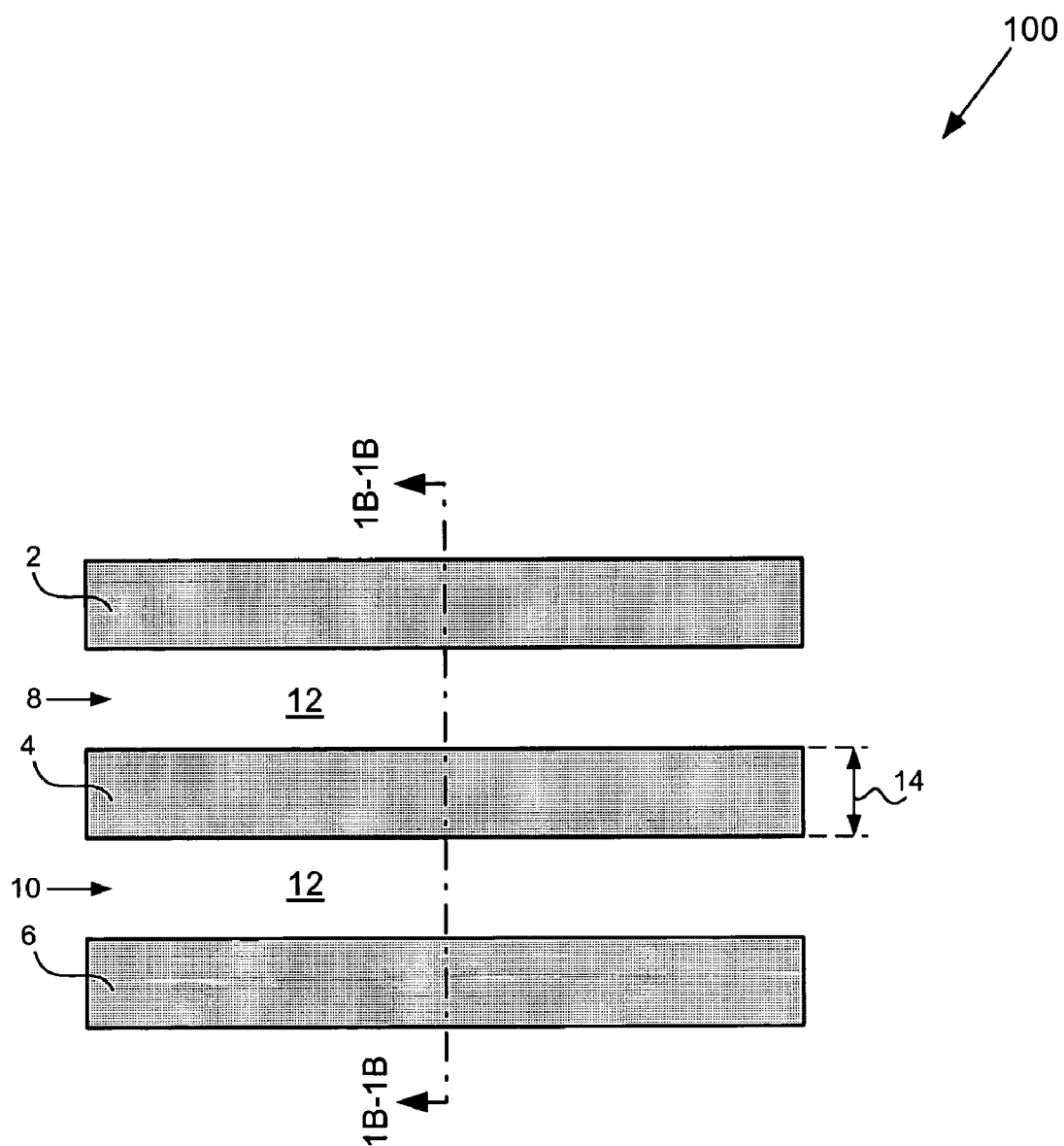
FIG. 1A illustrates a top view of some of the features of a memory array in an intermediate stage of fabrication, formed in accordance with one embodiment of the present invention.

FIG. 1A shows a top view of an exemplary memory array in an intermediate stage of fabrication in accordance with one embodiment of the present invention structure. Structure 100 includes trench masking lines 2, 4, and 6 and trenches 8 and 10. Structure 100 can be, for example, a memory array, such as a flash memory array, in an intermediate stage of fabrication. It is noted that although only trench masking lines 2, 4, and 6 and trenches 8 and 10 are shown in FIG. 1A to preserve brevity, structure 100 can include a large number of trench masking lines, such as masking lines 2, 4, and 6, and trenches, such as trenches 8 and 10, where each trench is situated between two adjacent masking lines.

As shown in FIG. 1A, trench masking lines 2, 4, and 6 are situated on wordline regions (not shown in FIG. 1A) of substrate 12, which can be a silicon substrate. In the present embodiment, trench masking lines 2, 4, and 6 can comprise a layer of resist, such as photoresist. In another embodiment, trench masking lines 2, 4, and 6 can comprise a layer of resist, such as photoresist, situated over a hard mask layer, which can comprise silicon nitride or other appropriate hard mask material. Trench masking lines 2, 4, and 6 have masking line width 14, which determines the width of wordline regions (not shown in FIG. 1A) situated under respective trench masking lines 2, 4, and 6. The width of the wordline regions (not shown in FIG. 1A), which corresponds to the distance between adjacent trenches, determines the active wordline width of wordlines that will be subsequently formed over wordline regions (not shown in FIG. 1A). Trench masking lines 2, 4, and 6 can be formed, for example, by depositing a masking layer on the surface of substrate 12 and appropriately patterning the masking layer. Also shown in FIG. 1A, trench 8 is situated in substrate 12 between trench masking lines 2 and 4 and trench 10 is situated in substrate 12 between trench masking lines 4 and 6. Trenches 8 and 10 can be formed in substrate 12 by using a dry etch process, such as a plasma etch process, to remove an appropriate amount of silicon in portions of substrate 12 not protected by trench masking lines, such as trench masking lines 2, 4, and 6. The dry etch process used to form trenches 8 and 10 causes substantially no undercutting of substrate 12 underneath the trench masking lines.

Figure 1B:
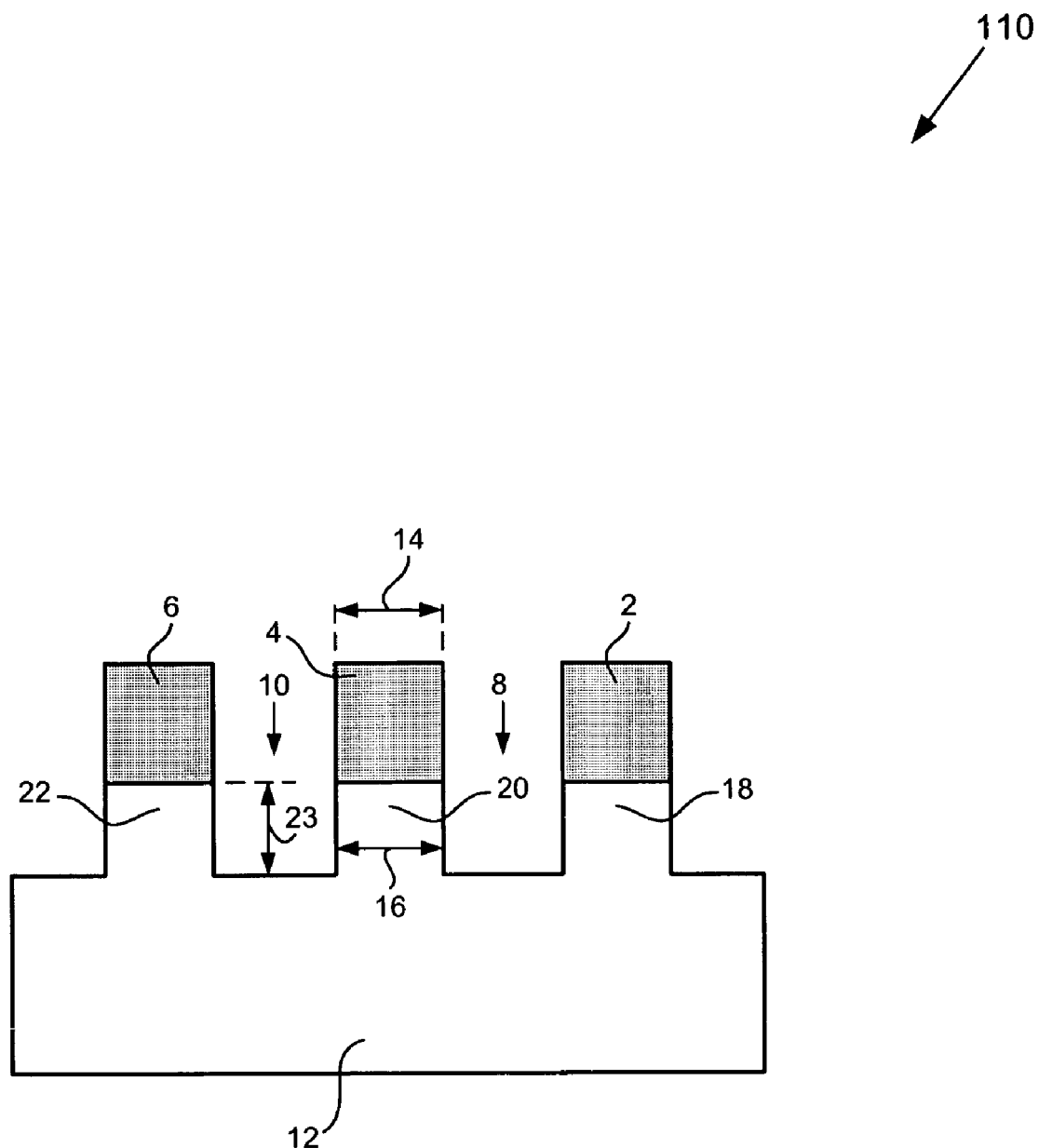
FIG. 1B illustrates a cross-sectional view along the line 1B-1B in FIG. 1A of the structure of FIG. 1A.

Referring to FIG. 1B, structure 110 in FIG. 1B corresponds to a cross-sectional view of structure 100 along line 1B-1B in FIG. 1A. As shown in FIG. 1B, trench masking lines 2, 4, and 6 are situated on respective wordline regions 18, 20, and 22 of substrate 12 and have wordline region width 16, which is substantially equal to masking line width 14. Wordline region width 16 is substantially equal to masking line width 14 and also substantially equal to the distance between adjacent trenches. Wordline region width 16 determines the active wordline width (i.e. wordline critical dimension) of wordlines that will be subsequently formed over wordline regions 18, 20, and 22. Also shown in FIG. 1B, trenches 8 and 10 have depth 23. By way of example, depth 23 can be between 400.0 Angstroms and 600.0 Angstroms. It is noted that although only trenches 8 and 10 and wordline regions 18, 20, and 22 are shown in FIG. 1B to preserve brevity, substrate 12 can include an appropriately large number trenches and wordline regions, where each wordline region is situated between two adjacent trenches.

Figure 2A:
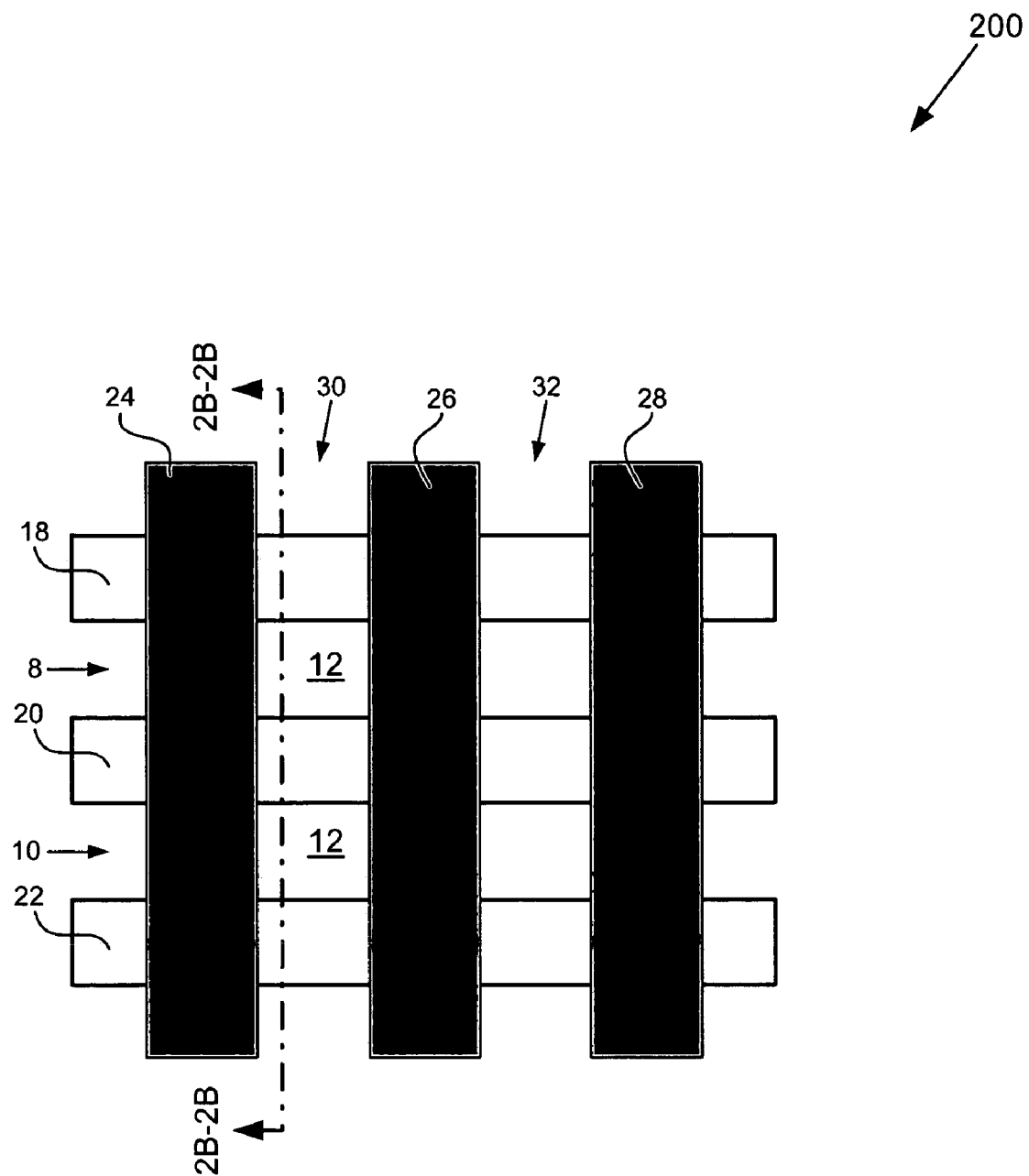
FIG. 2A illustrates a top view of some of the features of a memory array in an intermediate stage of fabrication, formed in accordance with one embodiment of the present invention.

FIG. 2A shows a top view of structure 200, which corresponds to structure 100 in FIG. 1A after removal of trench masking lines 2, 4, and 6 and formation of bitline masking lines 24, 26, and 28 and bitlines 30 and 32. Trench masking lines 2, 4, and 6 (shown in FIGS. 1A and 1B) can be removed by using an appropriate etch process. As shown in FIG. 2A, bitline masking lines 24, 26, and 28 are situated over and situated in a direction perpendicular to wordline regions 18, 20, and 22 and trenches 8 and 10. Bitline masking lines 24, 26, and 28 can comprise an appropriate masking material, such as photoresist. Bitline masking lines 24, 26, and 28 can be formed by depositing and appropriately patterning a layer of masking material, such as photoresist, over substrate 12. Also shown in FIG. 2A, bitline 30 is situated between bitline masking lines 24 and 26 in substrate 12 and bitline 32 is situated in substrate 12 between bitline masking lines 26 and 28 in substrate 12. Bitlines 30 and 32 are also situated perpendicular to wordline regions 18, 20, and 22, and trenches 8 and 10. Bitlines 30 and 32 can be formed by implanting an appropriate dopant in portions of substrate 12 situated between respective bitline masking lines 24 and 26 and bitline masking lines 26 and 28.

Figure 2B:
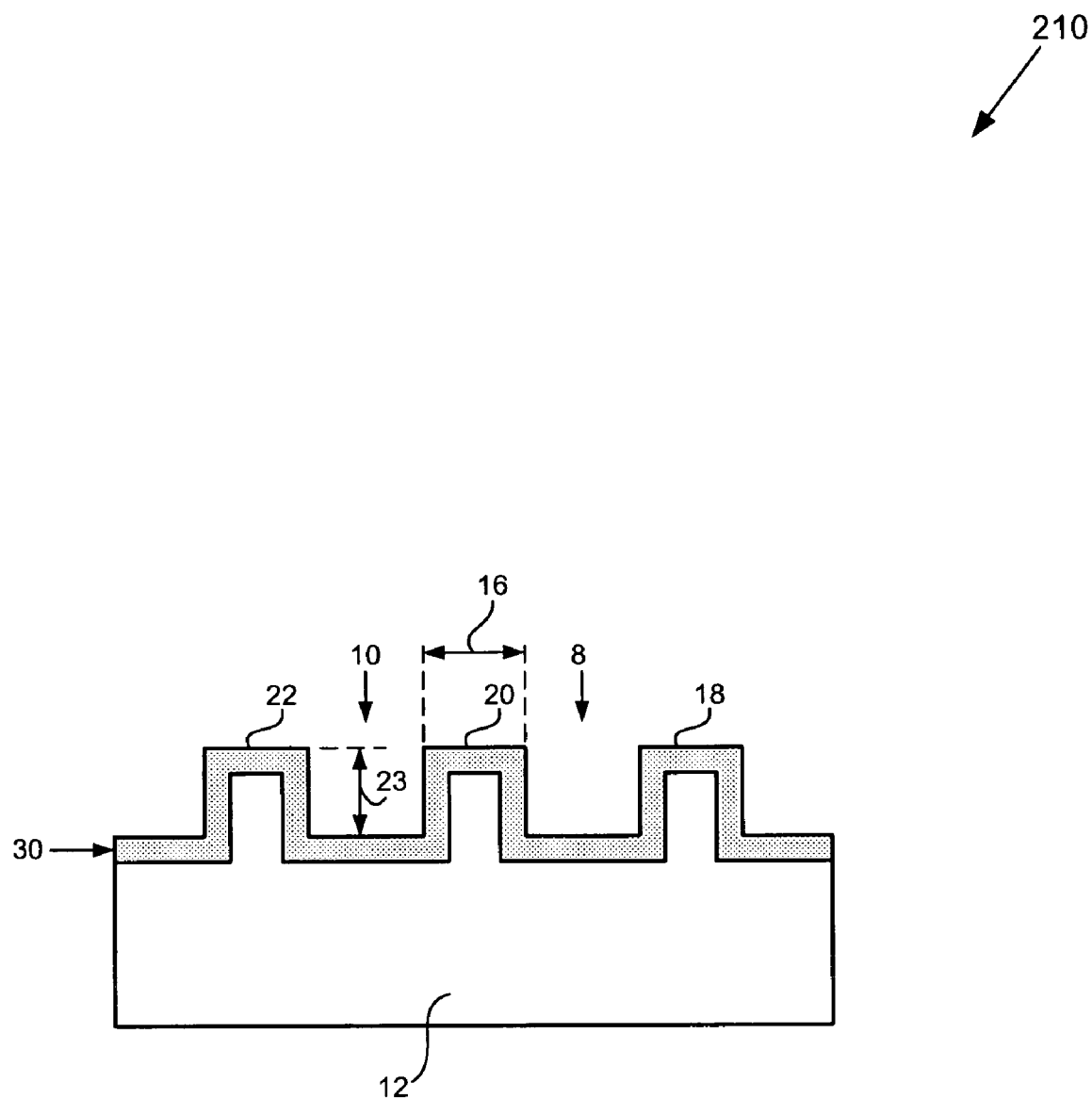
FIG. 2B illustrates a cross-sectional view along the line 2B-2B in FIG. 2A of the structure of FIG. 2A.

Referring to FIG. 2B, structure 210 corresponds to a cross-sectional view of structure 200 along line 2B-2B in FIG. 2A. As shown in FIG. 2B, bitline 30 is situated in substrate 12 between bitline masking lines 24 and 26 (shown in FIG. 2A) and extends through wordline regions 18, 20, and 22 and under trenches 8 and 10.

Figure 3A:
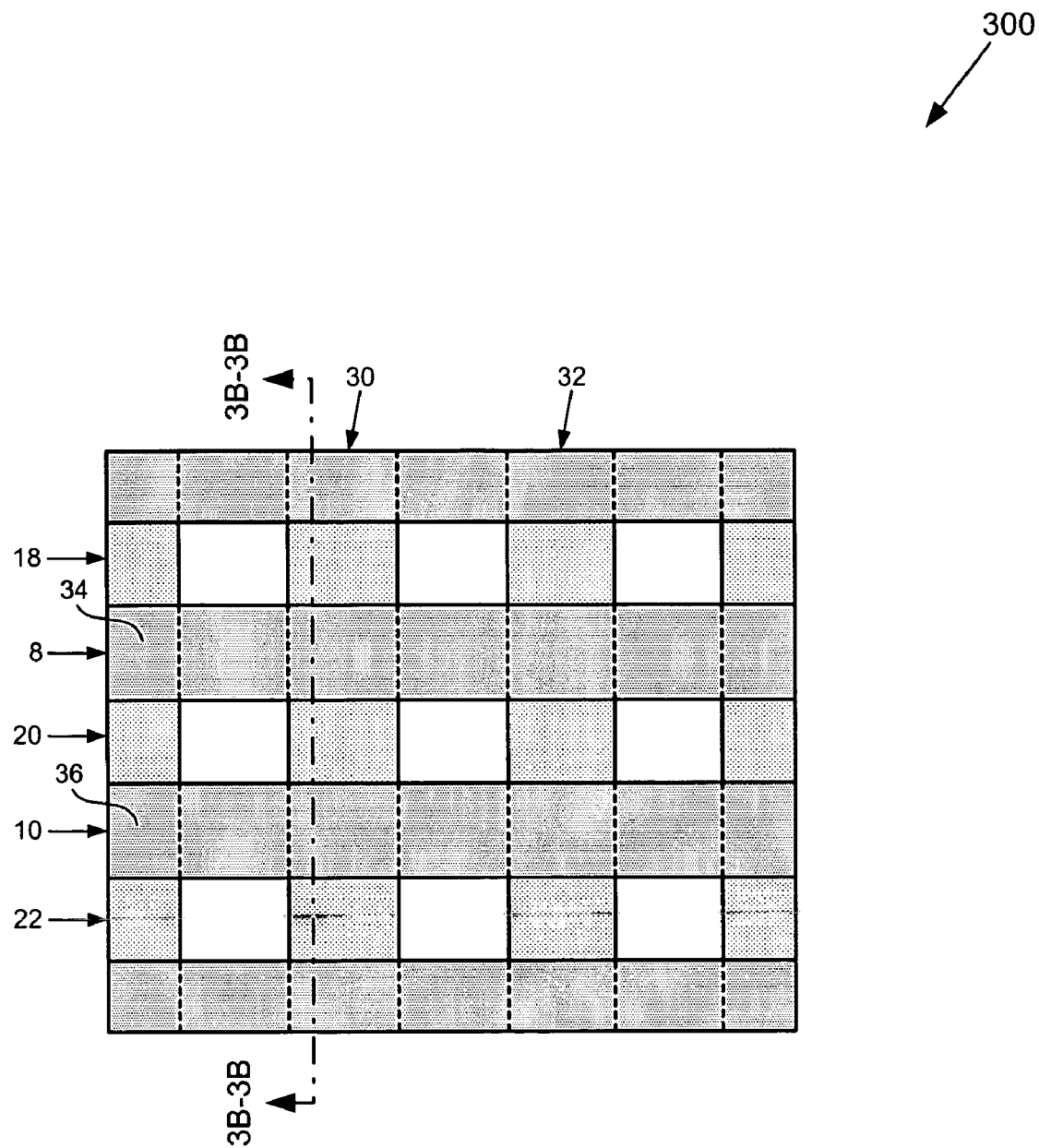
FIG. 3A illustrates a top view of some of the features of a memory array in an intermediate stage of fabrication, formed in accordance with one embodiment of the present invention.

FIG. 3A shows a top view of structure 300, which corresponds to structure 200 in FIG. 2A after removal of bitline masking lines 24, 26, and 28 and formation of dielectric regions 34 and 36. Bitline masking lines 24, 26, and 28 (shown in FIG. 2A) can be removed by using an appropriate etch process. As shown in FIG. 3A, dielectric regions 34 and 36 are situated in respective trenches 8 and 10 and can comprise silicon oxide or other appropriate dielectric material. Dielectric regions 34 and 36 can be formed by depositing a layer of dielectric material, such as silicon oxide, in trenches 8 and 10 and over substrate 12 and planarizing the layer of dielectric material to expose wordline regions 18, 20, and 22. The layer of dielectric material can be planarized by using a chemical mechanical polish (CMP) process to remove excess dielectric material, for example. Thus, after the planarization process, dielectric regions 34 and 36 are formed in respective trenches 8 and 10 so as to fill the trenches with dielectric material.

Figure 3B:
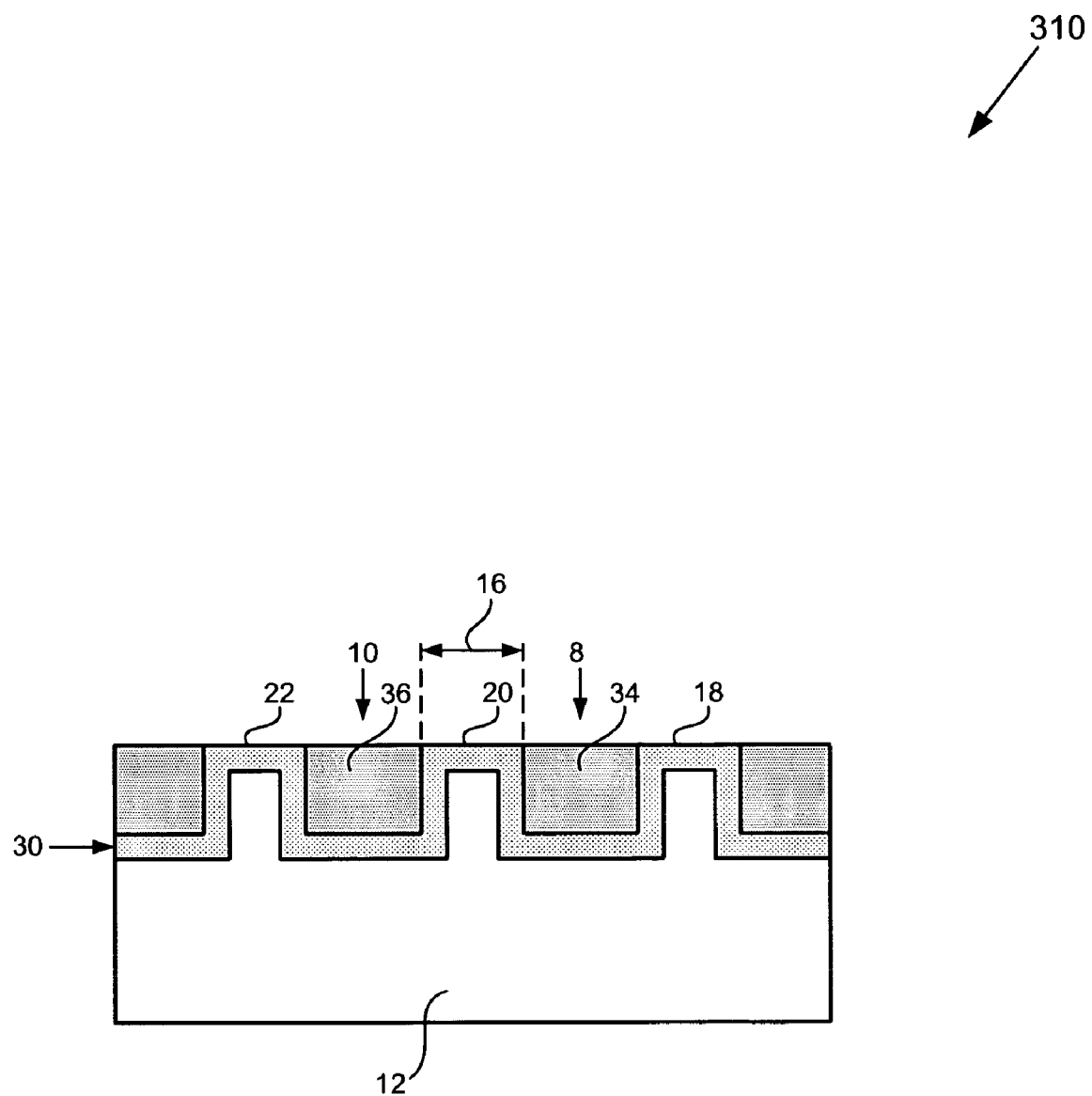
FIG. 3B illustrates a cross-sectional view along the line 3B-3B in FIG. 3A of the structure of FIG. 3A.

Referring to FIG. 3B, structure 310 corresponds to a cross-sectional view of structure 300 along line 3B-3B in FIG. 3A. As shown in FIG. 3B, dielectric region 34 is situated between wordline regions 18 and 20 in trench 8 and dielectric region 36 is situated between wordline regions 20 and 22 in trench 10. Also shown in FIG. 3B, as a result of the planarizing process discussed above, the top surface of substrate 12 is exposed in wordline regions 18, 20, and 22 and is situated in the same plane with the top surfaces of dielectric regions 34 and 36. Further shown in FIG. 3B, bitline 30 is situated under dielectric regions 34 and 36.

Figure 4A:
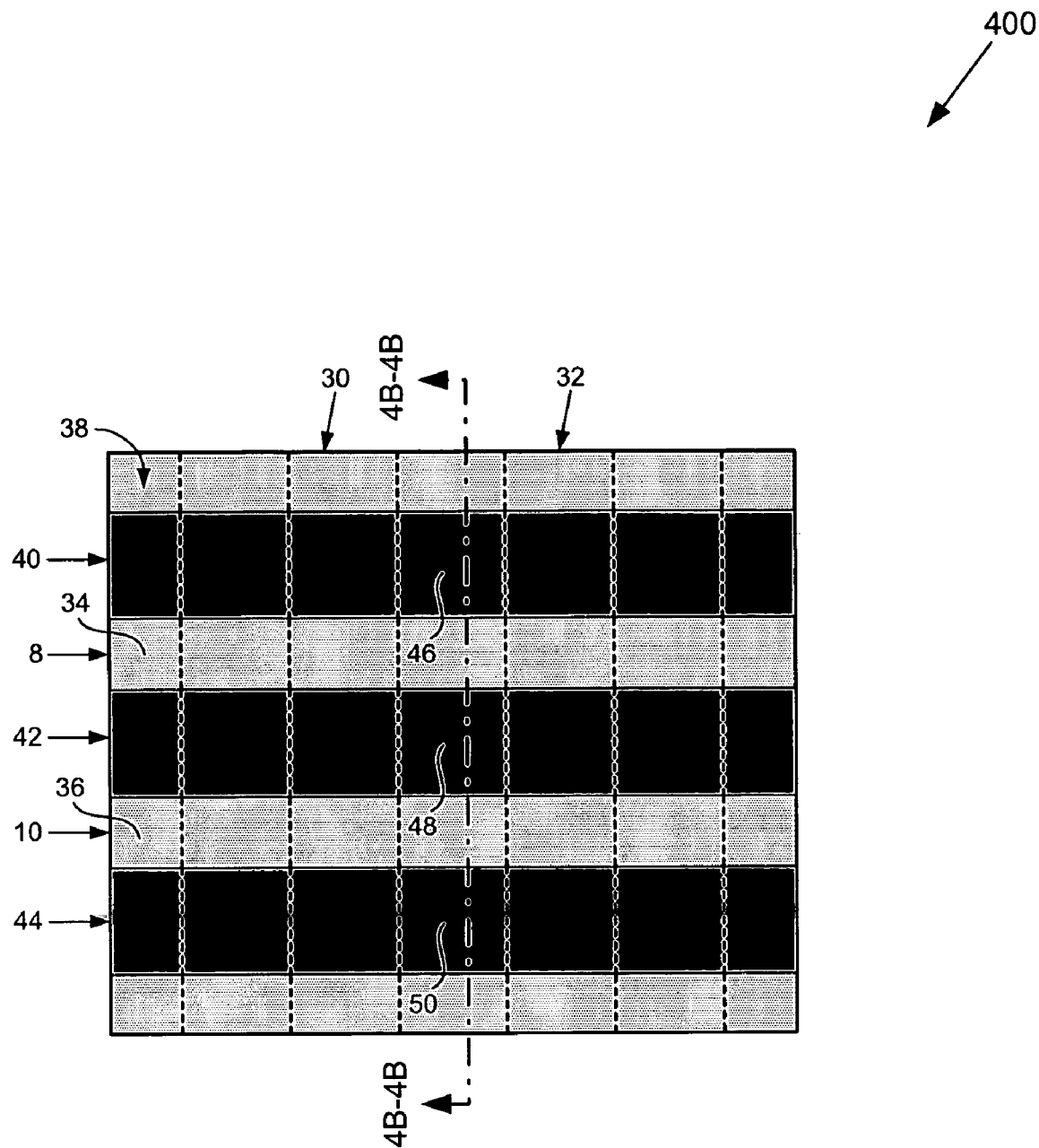
FIG. 4A illustrates a top view of some of the features of a memory array in an intermediate stage of fabrication, formed in accordance with one embodiment of the present invention.

FIG. 4A shows a top view of structure 400, which corresponds to structure 300 in FIG. 3A after formation of dielectric stack 38, wordlines 40, 42, and 44, and memory cells 46, 48, and 50. As shown in FIG. 4A, dielectric stack 38 is situated over substrate 12 (shown in FIGS. 1A, 1B, 2A, 2B, 3A, and 3B) and over dielectric regions 34 and 36

(shown in FIGS. 3A and 3B). Dielectric stack 38 can include a number of dielectric layers, which further include a charge storage layer. In the present embodiment, dielectric stack 38 can comprise an ONO (Oxide-Nitride-Oxide) stack, which includes a bottom oxide layer, a nitride layer situated over the bottom oxide layer, and a top oxide layer situated over the nitride layer. In the ONO stack, the nitride layer is utilized by subsequently formed memory cells for charge storage. The ONO stack can be formed by depositing an oxide layer over substrate 12 and dielectric regions 34 and 36, depositing a nitride layer over the oxide layer, and depositing another oxide layer over the nitride layer. In other embodiments, dielectric stack 38 can comprise a different combination of dielectric layers.

Also shown in FIG. 4A, wordlines 40, 42, and 44 are situated over and perpendicular to bitlines 30 and 32. Wordlines 40, 42, and 44 are also situated over respective wordline regions 18, 20, and 22 (shown in FIGS. 1B, 2A, 2B, 3A, and 3B). Wordlines 40, 42, and 44 can comprise polycrystalline silicon (polysilicon) or other appropriate conductive material. Wordlines 40, 42, and 44 can be formed, for example, by depositing and appropriately patterning a layer of polycrystalline silicon on dielectric stack 38. Further shown in FIG. 4A, memory cells 46, 48, and 50 are situated at the intersection of the region between bitlines 30 and 32 and respective wordlines 40, 42, and 44. Memory cells 46, 48, and 50 can be flash memory cells. Memory cells 46, 48, and 50 can also be 2-bit flash memory cells (i.e. flash memory cells capable of storing two independent bits in separate locations within the memory cell), such as Advanced Micro Devices' (AMD) MirrorBit™ flash memory cells. It is noted that although only memory cells 46, 48, and 50 are specifically discussed herein to preserve brevity, memory cells are situated at the intersection of each region between bitlines and each wordline in structure 400.

Figure 4B:
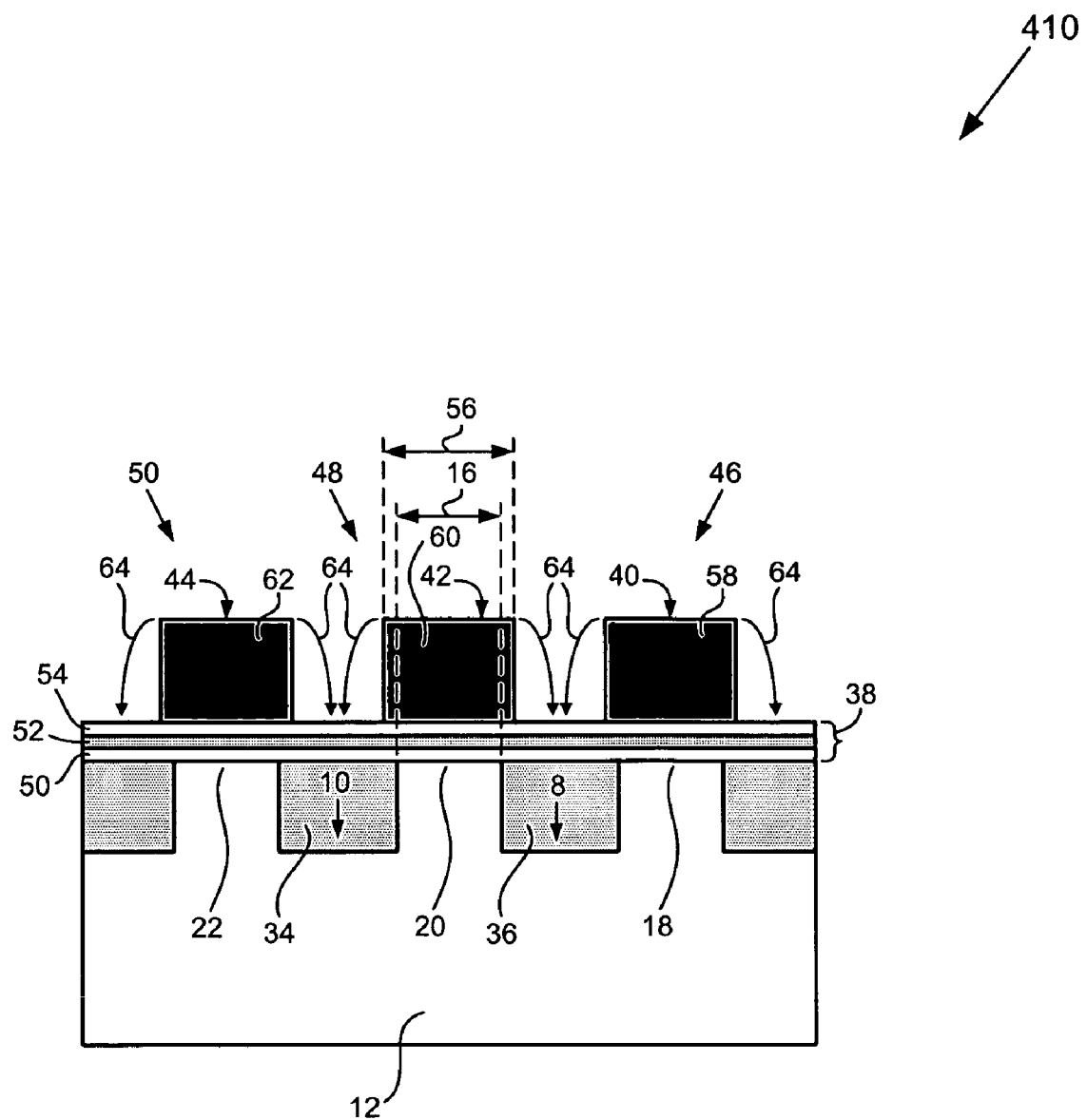
FIG. 4B illustrates a cross-sectional view along the line 4B-4B in FIG. 4A of the structure of FIG. 4A.

Referring to FIG. 4B, structure 410 corresponds to a cross-sectional view of structure 400 along line 4B-4B in FIG. 4A. As shown in FIG. 4B, dielectric stack 38 is situated over dielectric regions 34 and 36 and wordline regions 18, 20, and 22 of substrate 12. Dielectric stack 38 includes oxide layer 50, which is situated on dielectric regions 34 and 36 and wordline regions 18, 20, and 22, nitride layer 52, which is situated on oxide layer 50, and oxide layer 54, which is situated on nitride layer 52. Dielectric stack 38 can have a thickness of approximately 200.0 Angstroms, for example. Also shown in FIG. 4B, wordlines 40, 42, and 44 are situated on dielectric stack 38 and directly over respective wordline regions 18, 20, and 22 of substrate 12. Wordlines 40, 42, and 44 have actual (i.e. physical) wordline width 56 and an active wordline width that is substantially equal to wordline region width 14. In the present embodiment, actual wordline width 56 can be greater than the active wordline width, which is substantially equal to wordline region width 14. In another embodiment, actual wordline width 56 may be substantially equal to the active wordline width.

In the present invention, active wordline width (i.e. wordline critical dimension) is determined by wordline region width 14, which is precisely defined by the distance between adjacent trenches, such as trenches 8 and 10. As a result, the present invention advantageously achieves wordlines having increased active wordline width (i.e. wordline critical dimension) uniformity.

Also, in the present invention, the active wordline width is determined by patterning trenches in substrate 12 to form wordline regions between adjacent trenches. In contrast, in a conventional wordline formation process, the active wordline width is the same as the actual wordline width, which is determined by patterning a layer of polysilicon. However, since the active wordline width is not determined by the actual wordline width in the present invention, the present invention achieves increased actual wordline width formation tolerance compared to the conventional wordline formation process. As a result, the present invention advantageously achieves an increased memory array yield.

Additionally, since wordlines, such as wordlines 40, 42, and 44, can have a thickness of between 1000.0 Angstroms and 2000.0 Angstroms, the difficult associated with patterning polysilicon to achieve a desired wordline width as required in a conventional wordline formation process significantly increases as wordline dimensions are scaled down. However, since active wordline width is determined in the present invention by etching trenches in a silicon substrate instead of etching polysilicon, the present invention advantageously achieves increased wordline scalability compared to the conventional wordline formation process.

Also shown in FIG. 4B, memory cells 46, 48, and 50 are situated over respective wordline regions 18, 20, and 22 of substrate 12. Memory cells 46, 48, and 50 include wordline portions 58, 60, and 62 and portions of dielectric stack 38 situated under wordline portions 58, 60, and 62, respectively. By way of background, during a memory cell programming operation, parasitic current can flow between wordlines in portions of substrate 12 situated at or close to the interface with oxide layer 50 as a result of electric field lines 64, which originate from wordline sidewalls. The parasitic current can undesirably increase memory array power consumption and can cause undesirable memory cell threshold voltage distribution, which can reduce memory array performance and reliability.

In a conventional flash memory array, which does not include dielectric regions formed in trenches situated between adjacent wordlines, the dielectric stack, such as dielectric stack 38, can be situated on the substrate. Thus, in the conventional flash memory array, the parasitic current that is generated in the portion of the substrate situated between adjacent wordlines is inversely proportional to the equivalent oxide thickness (EOT) of the dielectric stack. However, by forming trenches between adjacent wordlines and forming dielectric regions in the trenches, the present invention achieves an increased EOT between adjacent wordlines compared to the EOT between adjacent wordlines in the conventional flash memory array. As a result, the present invention advantageously achieves a significantly decreased parasitic current in portions of the substrate situated between wordlines compared to the conventional memory array. Furthermore, by significantly reducing the parasitic current, the present invention advantageously reduces memory cell threshold voltage distribution.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a method for determining wordline critical dimension in a memory array and related structure have been described.

The invention claimed is:

1. A method for fabricating a memory array, said method comprising steps of:
    forming a plurality of trenches in a substrate, said plurality of trenches determining a plurality of wordline regions in said substrate, each of said plurality of wordline regions being situated between two adjacent trenches in said plurality of trenches, said each of said plurality of wordline regions having a wordline region width;
    forming a plurality of bitlines in said substrate, said plurality of bitlines being situated in a direction perpendicular to said plurality of trenches;
    forming a dielectric region in each of said plurality of trenches;
    forming a dielectric stack over said plurality of bitlines, said plurality of wordline regions, and said plurality of trenches;
    forming a plurality of wordlines, each of said plurality of wordlines being situated over one of said plurality of wordline regions;
    wherein said wordline region width determines an active wordline width of said each of said plurality of wordlines.

2. The method of claim 1 wherein said step of forming said dielectric region in each of said plurality of trenches comprises steps of:
    depositing a layer of silicon oxide over said plurality of trenches and said plurality of wordlines regions;
    planarizing said layer of silicon oxide to expose a top surface of said each of said plurality of wordline regions.

3. The method of claim 1 further comprising a step of forming a plurality of masking lines on said substrate prior to said step of forming said plurality of trenches in said substrate, wherein each of said plurality of masking lines has a masking line width, wherein said masking line width is substantially equal to said active wordline width.

4. The method of claim 1 wherein said dielectric stack comprises an ONO stack.

5. The method of claim 1 wherein said each of said plurality of trenches has a depth of between 400.0 Angstroms and 600.0 Angstroms.

6. The method of claim 1 further comprising a step of forming a plurality of memory cells, wherein each of said plurality of memory cells is formed at an intersection of a region between adjacent bitlines in said plurality of bitlines and one of said plurality of wordlines, wherein said each of said plurality of memory cells is a flash memory cell.

7. The method of claim 6 wherein said flash memory cell is a two-bit flash memory cell.

8. The method of claim 1 wherein said memory array is a flash memory array.

9. A memory array comprising:
    a plurality of trenches situated in a substrate;
    a plurality of wordline regions situated in said substrate, each of said plurality of wordline regions being situated between two adjacent trenches in said plurality of trenches, said each of said plurality of wordline regions having a wordline region width;
    a plurality of bitlines situated in said substrate, said plurality of bitlines being situated perpendicular to said plurality of wordline regions;
    a plurality of wordlines, each of said plurality of wordlines being situated over one of said plurality of wordline regions;
    a plurality of dielectric regions, wherein each of said plurality of dielectric regions is situated in one of said plurality of trenches;
    a dielectric stack situated over said plurality of bitlines, said plurality of wordline regions, and said plurality of trenches;
    wherein said wordline region width determines an active wordline width of each of said plurality of wordlines.

10. The memory array of claim 9 wherein said dielectric stack comprises an ONO stack.

11. The memory array of claim 9 further comprising a plurality of memory cells, wherein each of said plurality of memory cells is situated at an intersection of a region between adjacent bitlines in said plurality of bitlines and one of said plurality of wordlines, wherein said each of said plurality of memory cells is a flash memory cell.

12. The memory array of claim 11 wherein said flash memory cell is a two-bit flash memory cell.

13. The memory array of claim 9 wherein each of said plurality of trenches has a depth of between 400.0 Angstroms and 600.0 Angstroms.

14. The memory array of claim 9 wherein said plurality of dielectric regions comprise silicon oxide.

15. The memory array of claim 9 wherein said each of said plurality of wordlines has an actual wordline width, wherein said actual wordline width is greater than said active wordline width.

16. The memory array of claim 9 wherein said memory array is a flash memory array.

* * * * *